US012439741B2

(12) United States Patent
Choi et al.

(10) Patent No.: US 12,439,741 B2
(45) Date of Patent: Oct. 7, 2025

(54) SEMICONDUCTOR LIGHT-EMITTING DEVICE PACKAGE AND DISPLAY DEVICE COMPRISING SAME

(71) Applicant: LG ELECTRONICS INC., Seoul (KR)

(72) Inventors: Bongseok Choi, Seoul (KR); Sungjin Park, Seoul (KR); Joonkwon Moon, Seoul (KR); Taesu Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 449 days.

(21) Appl. No.: 18/010,085

(22) PCT Filed: Jun. 15, 2020

(86) PCT No.: PCT/KR2020/007732
§ 371 (c)(1),
(2) Date: Dec. 13, 2022

(87) PCT Pub. No.: WO2021/256574
PCT Pub. Date: Dec. 23, 2021

(65) Prior Publication Data
US 2024/0038933 A1 Feb. 1, 2024

(51) Int. Cl.
*H10H 20/831* (2025.01)
*H01L 25/075* (2006.01)
(Continued)

(52) U.S. Cl.
CPC ....... *H10H 20/831* (2025.01); *H01L 25/0753* (2013.01); *H10H 20/835* (2025.01);
(Continued)

(58) Field of Classification Search
CPC .... H10H 20/83; H10H 20/831; H10H 20/851; H10H 20/835; H10H 20/857;
(Continued)

(56) References Cited

U.S. PATENT DOCUMENTS

2014/0367705 A1  12/2014  Bibl et al.
2016/0336489 A1  11/2016  Nishimura et al.
(Continued)

FOREIGN PATENT DOCUMENTS

JP      2006-332320 A    12/2006
KR  10-2009-0090812 A     8/2009
(Continued)

OTHER PUBLICATIONS

International Search Report (PCT/ISA/210), issued in PCT/KR2020/007732, dated Mar. 15, 2021.

*Primary Examiner* — Antonio B Crite
(74) *Attorney, Agent, or Firm* — Birch, Stewart, Kolasch & Birch, LLP

(57) ABSTRACT

The embodiment relates to a semiconductor light emitting device package and a display device including the same. Semiconductor light emitting device package according to an embodiment can comprises a light emitting structure 155 including a first conductivity type semiconductor layer 155a, an active layer 155b, and a second conductivity type semiconductor layer 155c; a first electrode 151 and a second electrode 152 electrically connected to the first conductivity type semiconductor layer 155a and the second conductivity type semiconductor layer 155c of the light emitting structure 155, respectively; an interlayer insulating layer disposed on the side of the light emitting structure 155 and an adhesive layer 158 disposed on the light emitting structure 155.
The first electrode 151 can include a first reflective electrode 151a and a first pad electrode 151b, the second electrode 152 also can include a second reflective electrode 152a and a second pad electrode 152b, and a cross-sectional shape of the first reflective electrode 151a and the second reflective electrode 152a can comprise a cup shape.

18 Claims, 10 Drawing Sheets

(51) Int. Cl.
*H10H 20/832* (2025.01)
*H10H 20/85* (2025.01)
*H10H 20/853* (2025.01)
*H10H 20/856* (2025.01)
*H10H 20/857* (2025.01)
*H10H 29/14* (2025.01)
*H10H 20/01* (2025.01)

(52) U.S. Cl.
CPC ........ *H10H 20/853* (2025.01); *H10H 20/857* (2025.01); *H10H 20/032* (2025.01); *H10H 20/0362* (2025.01); *H10H 20/0364* (2025.01)

(58) Field of Classification Search
CPC ............. H10H 20/856; H10H 20/0364; H10H 20/032; H10H 20/018; H10H 20/85
See application file for complete search history.

(56) References Cited

U.S. PATENT DOCUMENTS

| | | | |
|---|---|---|---|
| 2017/0005245 A1 | 1/2017 | Hsu et al. | |
| 2017/0092825 A1* | 3/2017 | Bando | H10H 20/8515 |
| 2017/0309793 A1 | 10/2017 | Seo et al. | |
| 2018/0342492 A1 | 11/2018 | Lu | |
| 2019/0252585 A1* | 8/2019 | Hsieh | H10H 29/142 |
| 2020/0028046 A1* | 1/2020 | Kim | H10H 20/018 |
| 2021/0399080 A1 | 12/2021 | Lee et al. | |

FOREIGN PATENT DOCUMENTS

| | | |
|---|---|---|
| KR | 10-2010-0046558 A | 5/2010 |
| KR | 10-2016-0010537 A | 1/2016 |
| KR | 10-2017-0121777 A | 11/2017 |
| KR | 10-2020-0011964 A | 2/2020 |
| KR | 10-2020-0046223 A | 5/2020 |

* cited by examiner

[FIG. 1]
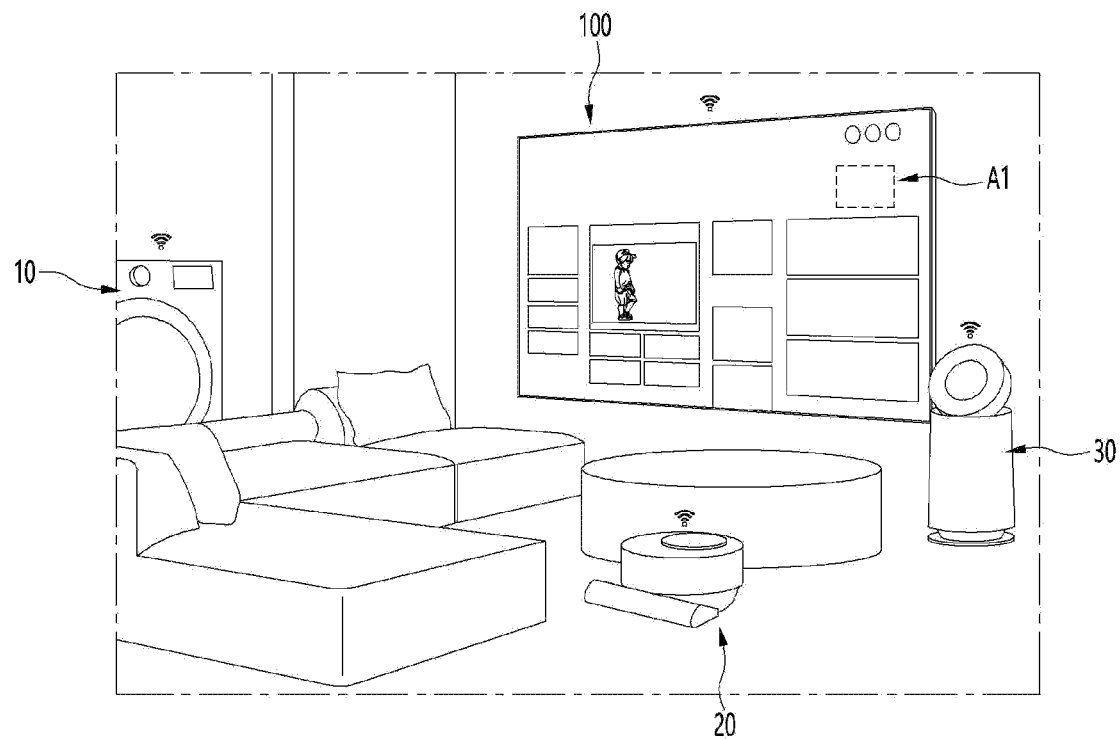

[FIG. 2]
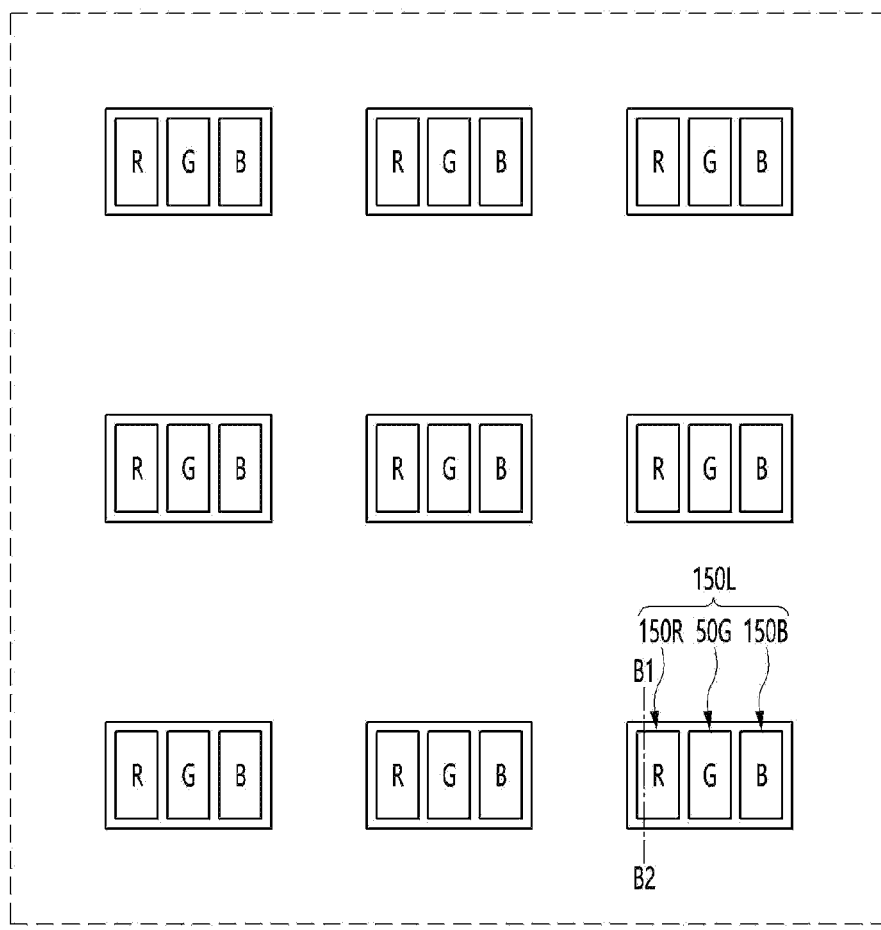

[FIG. 3A]
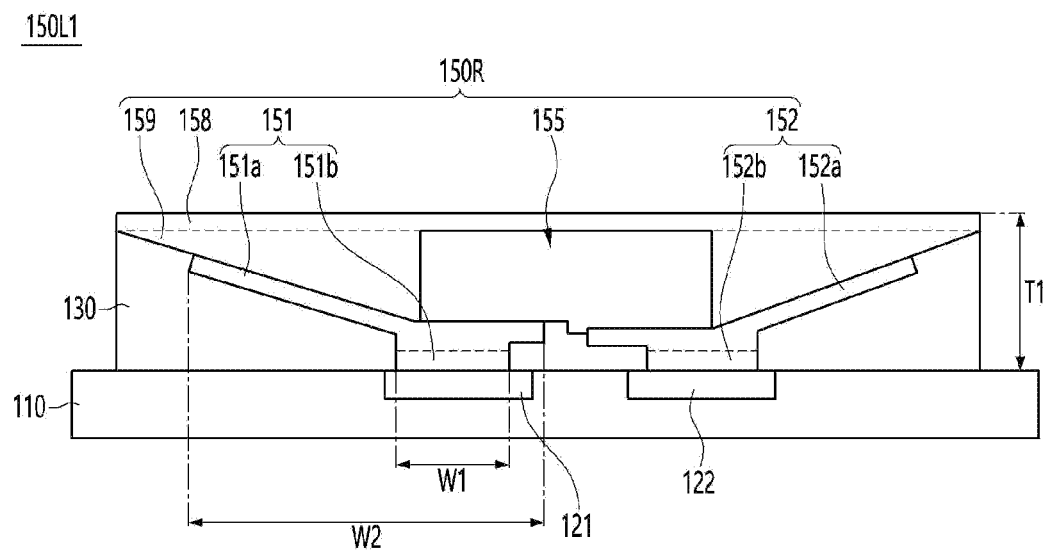

[FIG. 3B]
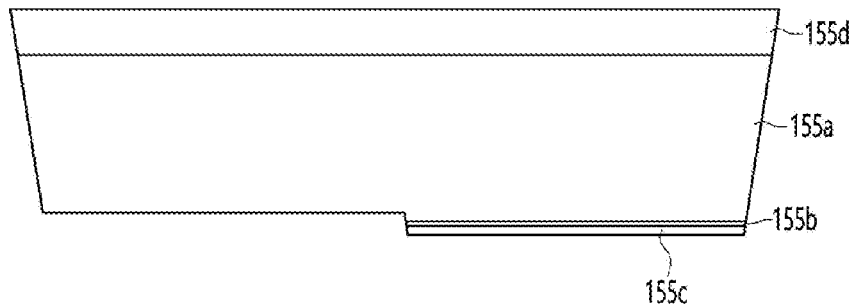
[FIG. 4A]
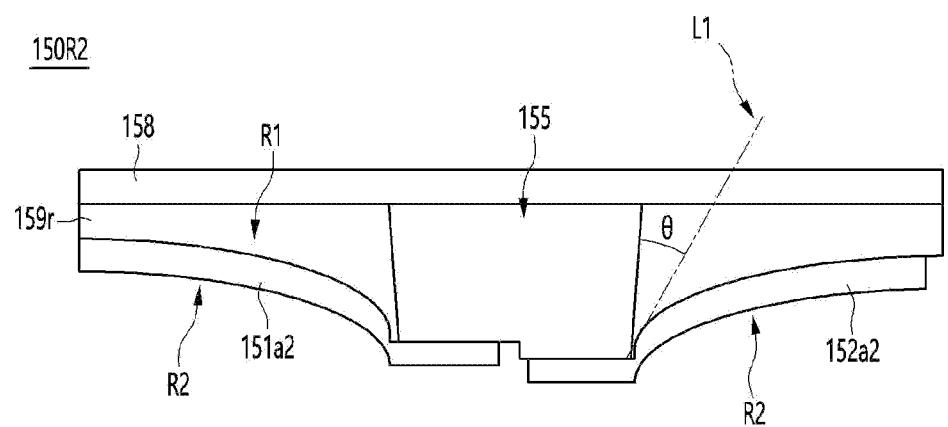
[FIG. 4B]
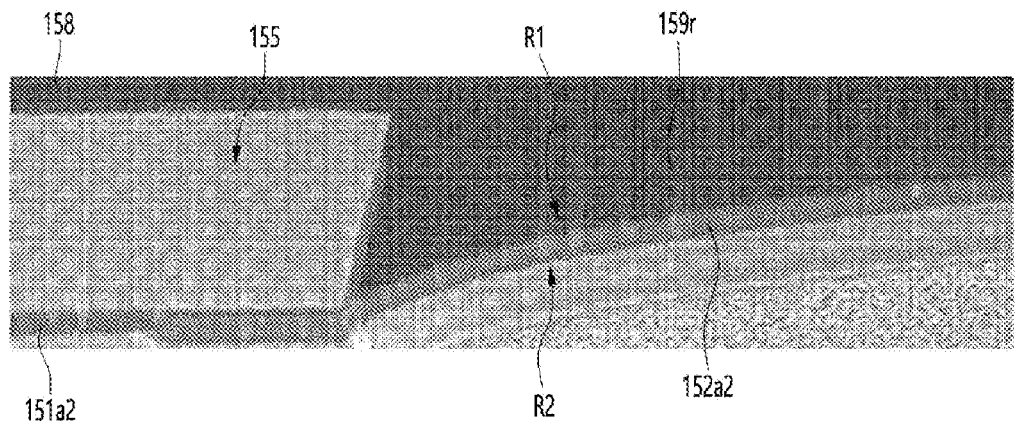

[FIG. 5A]
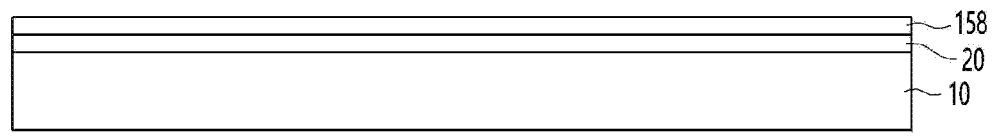
[FIG. 5B]
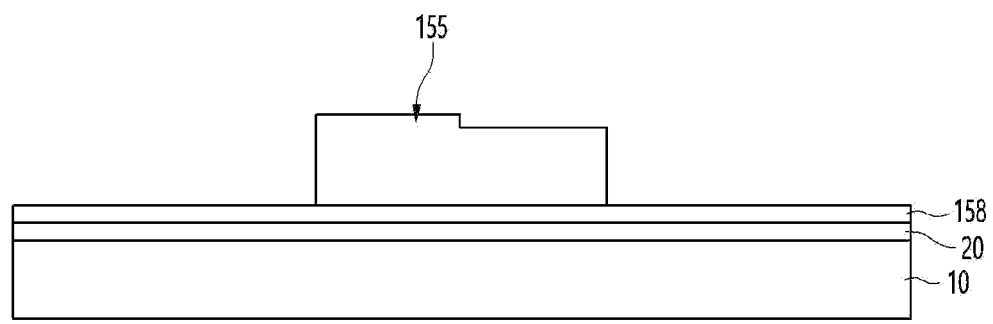
[FIG. 5C]
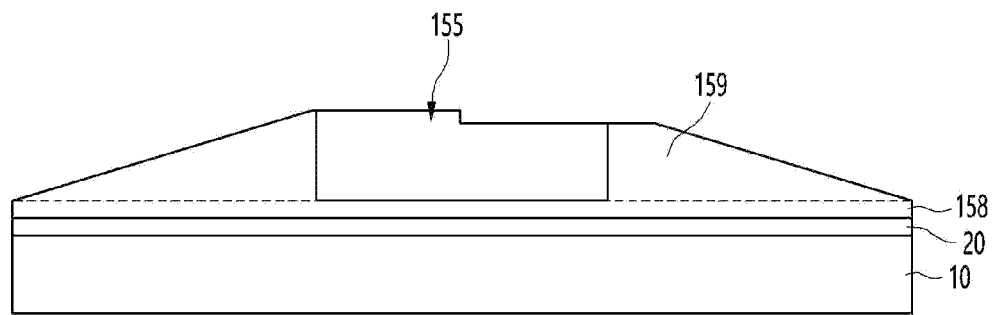

[FIG. 5D]
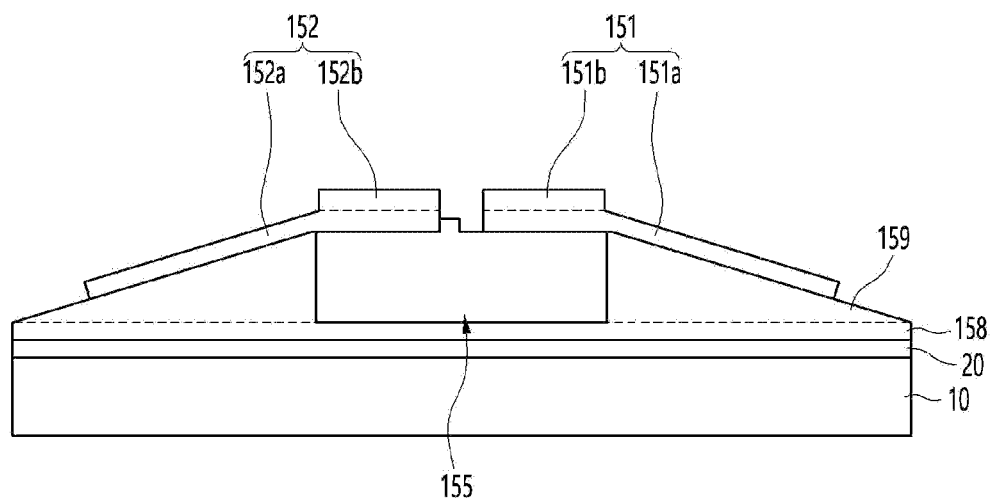

[FIG. 5E]
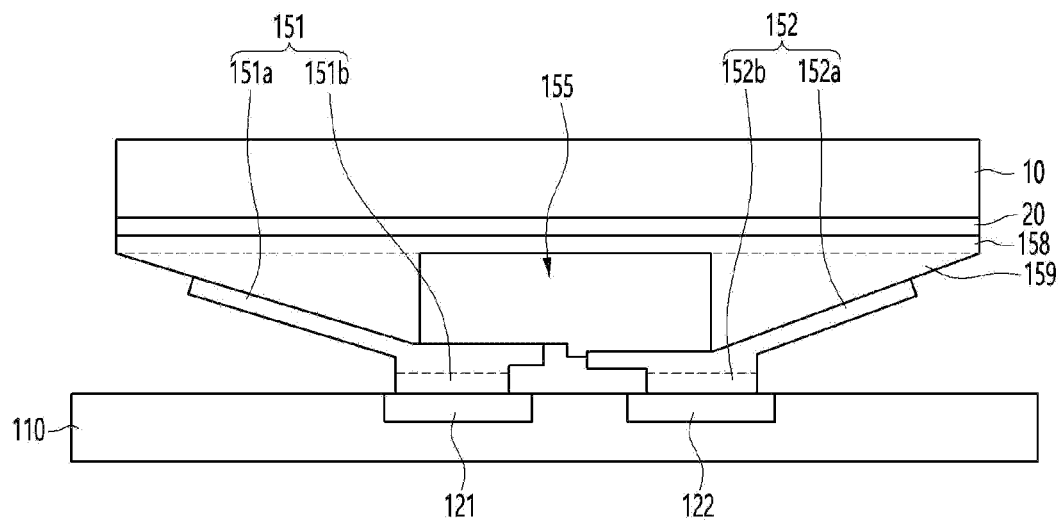
[FIG. 5F]
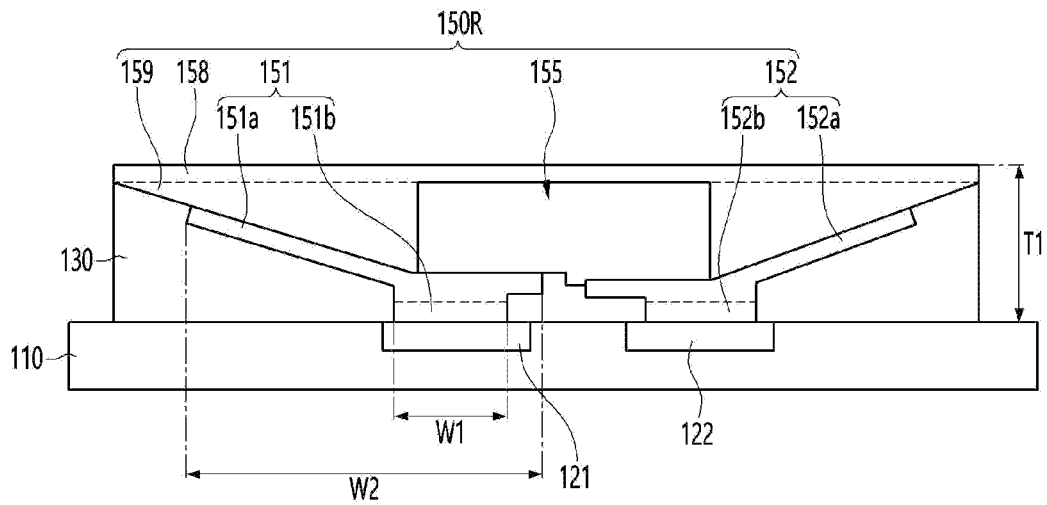

[FIG. 6A]
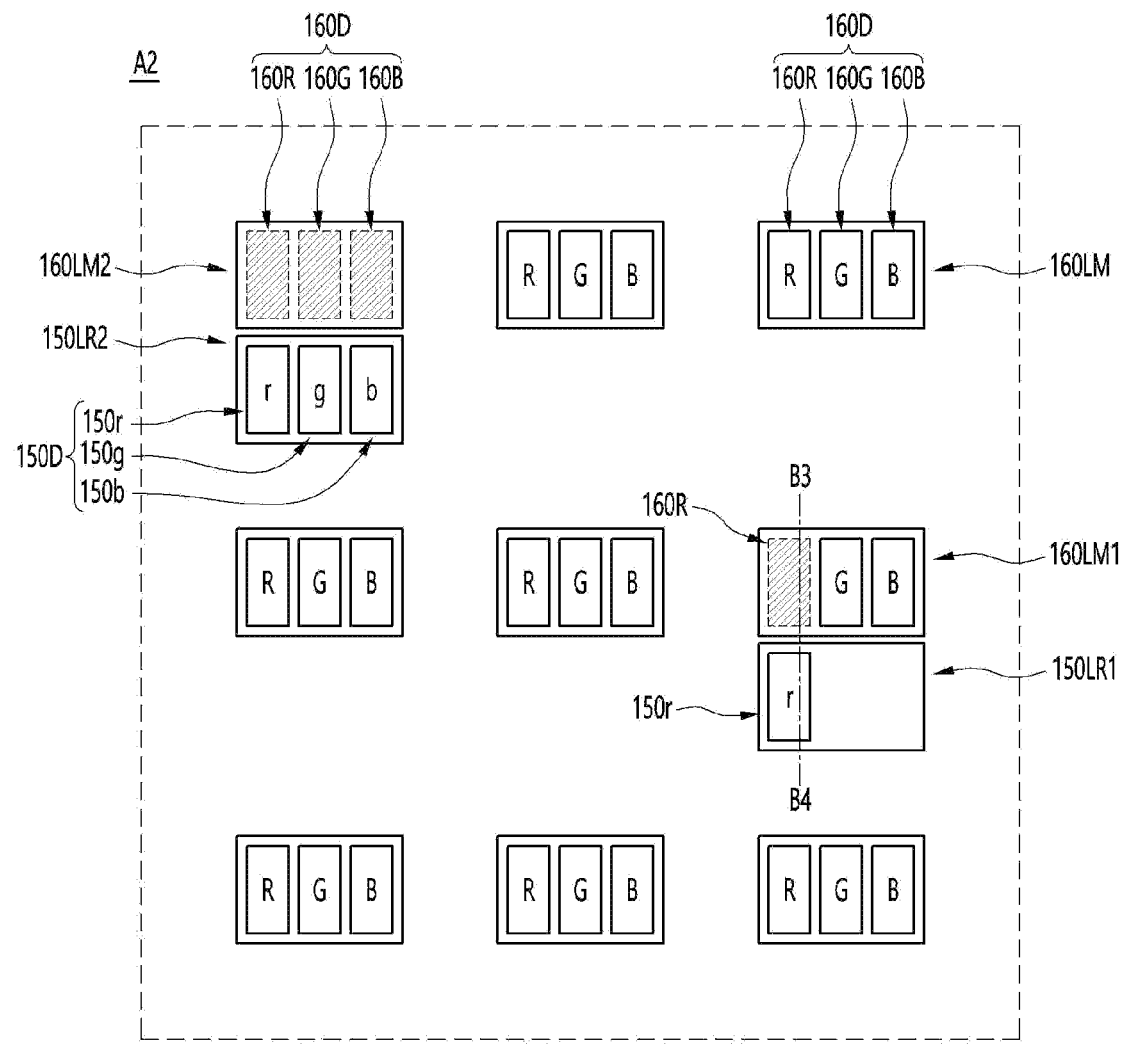

[FIG. 6B]
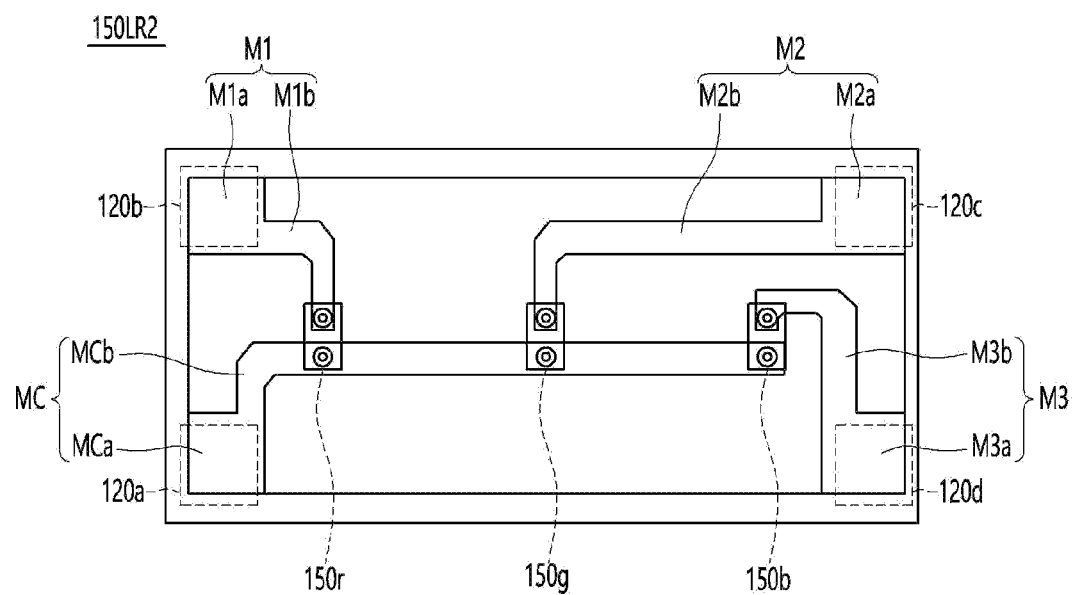

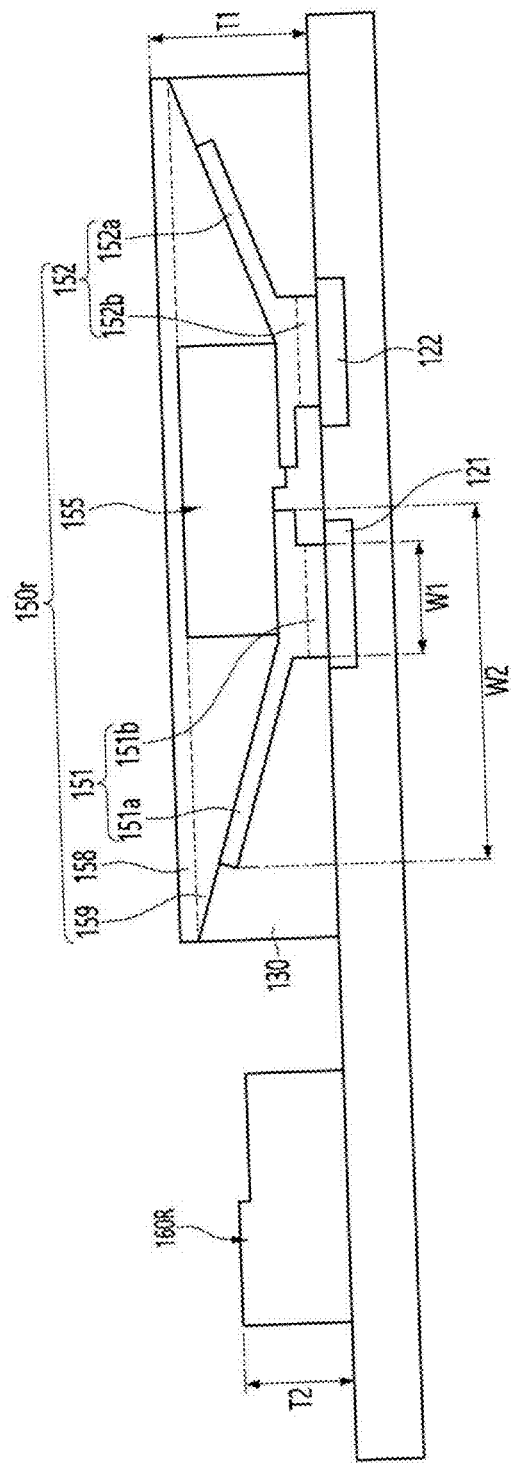

SEMICONDUCTOR LIGHT-EMITTING DEVICE PACKAGE AND DISPLAY DEVICE COMPRISING SAME

CROSS REFERENCE TO RELATED APPLICATIONS

This application is the National Phase of PCT International Application No. PCT/KR2020/007732, filed on Jun. 15, 2020, which is hereby expressly incorporated by reference into the present application.

TECHNICAL FIELD

Embodiment relates to a semiconductor light emitting device package and a display device including the same.

BACKGROUND ART

Technologies for implementing large-area displays include liquid crystal displays (LCDs), OLED displays, and micro-LED displays.

The micro-LED display is a display using micro-LED, which is a semiconductor light emitting device having a diameter or cross-sectional area of 100 μm or less, as a display device.

Micro-LED display has excellent performance in many characteristics such as contrast ratio, response speed, color reproduction rate, viewing angle, brightness, resolution, lifespan, luminous efficiency and luminance because it uses micro-LED, which is a semiconductor light emitting device, as a display device.

In particular, the micro-LED display has the advantage of being able to separate and combine the screens in a modular way, so that the size or resolution can be adjusted freely and the flexible display can be implemented.

However, there is a technical problem in that it is difficult to quickly and accurately transfer the semiconductor light emitting device to the display panel because more than millions of semiconductor light emitting devices are required for a large micro-LED display.

Transfer technologies that have been recently developed include a pick and place process, a laser lift-off method, or a self-assembly method.

Meanwhile, in order to improve the low transfer rate and lighting rate of the micro-LED display, in the prior art, a method of arranging a main pixel and an auxiliary pixel at the same time or using a repair chip to secure a yield has been proposed.

However, in the method of using the auxiliary pixels, since the same number of auxiliary chips as the main pixel should be arranged, twice as many chips are to be transferred than the actual required chips. Accordingly, the conventional method of using the auxiliary pixel increases the difficulty of panel design and transfer process, and has a problem of increasing the chip material cost.

Also, conventional LED packages are common in sizes of hundreds μm or more, but the thickness of the package is also as thick as several hundred μm. Accordingly, when an additional LED package is mounted through a repair process when a defective chip is generated after the LED transfer process, the technology of replacing the defective chip through the repair process is limited due to the issue of the step difference due to the thick thickness of the LED package.

Also, in order to improve the competitiveness of micro-LED displays, it is necessary to improve the light extraction efficiency of semiconductor light emitting device packages along with high transfer efficiency.

However, to improve light extraction efficiency in a conventional LED package, it is common to use a light extraction structure such as PSS (Patterned Sapphire Substrate). However, the conventional PSS structure is formed on a sapphire substrate, which is a growth substrate. When the growth substrate remains, there is a problem in that it is difficult to apply to an ultra-thin micro-LED display as the thickness of the micro-LED package becomes thick.

DISCLOSURE

Technical Problem

One of the technical problems of the embodiment is to provide a semiconductor light emitting device package and a display device including the same that can solve the problem that the repair process does not proceed properly due to the step issue due to the thickness of the light emitting device package during the repair process in the micro-LED display transfer process.

Also, since the conventional light emitting device package has a problem in that the thickness becomes thicker as the growth substrate remains to improve the light extraction efficiency, one of the technical problems of the embodiment is to provide a semiconductor light emitting device package and a display device including the same capable of improving light extraction efficiency while implementing an ultra-thin micro-LED display.

The technical problems of the embodiment are not limited to those described in this section, and include those that can be understood through the description of the invention.

Technical Solution

The semiconductor light emitting device package according to the embodiment can include a light emitting structure 155 including a first conductivity type semiconductor layer 155a, an active layer 155b, a second conductivity type semiconductor layer 155c, a first electrode 151 and a second electrode 152 electrically connected to the first conductivity type semiconductor layer 155a, the second conductivity type semiconductor layer 155c of the light emitting structure 155, respectively, an interlayer insulating layer disposed on the side of the light emitting structure 155 and an adhesive layer 158 disposed on the light emitting structure 155

The first electrode 151 can include a first reflective electrode 151a and a first pad electrode 151b, the second electrode 152 also can include a second reflective electrode 152a and a second pad electrode 152b, and a cross-sectional shape of the first reflective electrode 151a and the second reflective electrode 152a can comprise a cup shape.

A first thickness T1 from the first electrode 151 to the adhesive layer 158 can be or less.

The first reflective electrode 151a and the second reflective electrode 152a can be disposed to extend to the upper and side surfaces of the first interlayer insulating layer 159.

The second horizontal width W2 of the first reflective electrode 151a or the second reflective electrode 152a can be longer than the first horizontal width W1 of the first pad electrode 151b or second pad electrode 152b.

The second horizontal width W2 of the first reflective electrode 151a or the second reflective electrode 152a can be longer than the horizontal width of the light emitting structure 155.

The end of the first reflective electrode 151a or the end of the second reflective electrode 152a located in a direction away from the light emitting structure 155 can be disposed higher than the active layer 155b of the light emitting structure 155.

The interlayer insulating layer can include a first round inclined surface R1.

The first reflective electrode and the second reflective electrode disposed on the interlayer insulating layer can include a second round inclined surface R2 corresponding to the first round inclined surface R1.

At the edge of the light emitting structure 155, a first angle θ between the first tangent line L1 to the second round inclined surface R2 of the second reflective electrode and the side surface of the light emitting structure 155 can range from 10 to 70 degrees.

The display device according to the embodiment can include a panel substrate 110 including a first wiring electrode 121 and a second wiring electrode 122 and the semiconductor light emitting device package according to any one of claims 1 to 9 disposed on the panel substrate.

The second horizontal width W2 of the first reflective electrode 151a or the second reflective electrode 152a can be longer than the horizontal width of the first wiring electrode 121 or the second wiring electrode 122 formed on the panel substrate 110.

The display device can include a main pixel and an auxiliary pixel, and the auxiliary pixel can include a common wiring MC, a first wiring M1, a second wiring M2, and a third wiring M3.

A first auxiliary semiconductor light emitting device 150r can be mounted in a flip chip form on the common wiring MC and the first wiring M1, a second auxiliary semiconductor light emitting device 150g can be mounted in a flip chip form on the common wiring MC and the second wiring M2, and a third auxiliary semiconductor light emitting device 150b can be mounted on the common wiring MC and the third wiring M3 in a flip chip form.

The common wiring MC can include a wiring pad MCa and a common branch wiring MCb), the first wire M1 can include a first pad M1a and a first branch wire M1b, the second wire M2 can include a second pad M2a and a second branch wire M2b, and the third wire M3 can include a third pad M3a and a third branch wire M3b.

The first auxiliary semiconductor light emitting device 150r can be mounted in a flip chip form on the first region of the common branch wiring MCb and the first branch wiring M1b, the second auxiliary semiconductor light emitting device 150g can be mounted in a flip chip form on a second region of the common branch wiring MCb and the second branch wiring M2b, and the third auxiliary semiconductor light emitting device 150b can be mounted in a flip chip form on the third region of the common branch wiring MCb and the third branch wiring M3b.

Effects of the Invention

According to the semiconductor light emitting device package according to the embodiment and the display device including the same, there are complex technical effects capable of improving light extraction efficiency of the semiconductor light emitting device package along with high efficiency of the transfer process of the semiconductor light emitting device.

For example, unlike the conventional light emitting device package, in the embodiment, by removing the growth substrate and improving the light extraction efficiency by the reflective electrode structure, there are complex technical features that can improve the light extraction efficiency of the semiconductor light emitting device package along with the high efficiency of the transfer process by resolving the step difference issue.

Also, the embodiment can provide a semiconductor light emitting device package capable of improving light extraction efficiency while implementing an ultra-thin micro-LED display and a display device including the same. For example, according to the embodiment, by implementing the cross-sectional shape of the first reflective electrode 151a and the second reflective electrode 152a of the semiconductor light emitting device package into a cup shape, there is a technical effect of improving light extraction efficiency while implement an ultra-thin semiconductor light emitting device package.

Also, for example, in the embodiment, since the end of the first reflective electrode 151a or the end of the second reflective electrode 152a is disposed higher than the active layer 155b of the light emitting structure 155, there is a technical effect that can improve the light extraction efficiency of the light emitted from the active layer to the upper side and contribute to the function as a pixel of the display device.

Also, according to the second embodiment, as the first-second reflective electrode 151a2 and the second-second reflective electrode 152a2 include the second round inclined surface R2, there are technical effects that the light emitted from the light emitting structure can improve the light extraction efficiency to the upper surface and function optimally as a display pixel through combination with the light emitted from the semiconductor light emitting device of other sub-pixels within the unit pixel.

Also, according to the embodiment, by forming a common wire in the second auxiliary pixel region, flip-chip bonding of the first to third auxiliary semiconductor light emitting elements can be easily performed, so the wiring structure can be managed compactly, and the efficiency of the light emitting element driving circuit can be improved.

The technical effects of the embodiments are not limited to those described in this section, but include those that can be understood through the description of the invention.

DESCRIPTION OF DRAWINGS

FIG. 1 is an exemplary view in which a display device 100 according to an embodiment is disposed in a living room together with a washing machine 10, a robot cleaner an air purifier 30, and the like.

FIG. 2 is an enlarged view of the first panel area A1 in the display device 100 of FIG. 1.

FIG. 3A is a cross-sectional view taken along line B1-B2 of the first semiconductor light emitting device 150R, which is a sub-pixel, among the first semiconductor pixel region 150L1, which is one unit pixel in FIG. 2.

FIG. 3B is a detailed view of the light emitting structure 155 of the first semiconductor light emitting device 150R in FIG. 3A.

FIG. 4A is a cross-sectional view of the first-second semiconductor light emitting device 150R2 according to the second embodiment.

FIG. 4B is an SEM picture to which the first-second semiconductor light emitting devices 150R2 are applied.

FIG. 5A to 5F are cross-sectional views of a manufacturing process of a display device including a semiconductor light emitting device of an embodiment.

FIG. 6A is a conceptual diagram of the second panel area A2 in the display device 100 according to the second embodiment.

FIG. 6B is a detailed projection view of the wiring structure of the auxiliary pixel in FIG. 6A.

FIG. 6C is a cross-sectional conceptual view taken along line B3-B4 in FIG. 6A.

MODE FOR INVENTION

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. Also, the accompanying drawings are provided for easy understanding of the embodiments disclosed in the present specification, and the technical ideas disclosed in the present specification are not limited by the accompanying drawings. Also, when an element, such as a layer, region, or substrate, is referred to as being 'on' another component, this includes that it is directly on the other element or there can be other intermediate elements in between.

The display device described in this specification can include a mobile phone, a smart phone, a laptop computer, a digital broadcasting terminal, a personal digital assistant (PDA), a portable multimedia player (PMP), a navigation, a Slate PC, a Tablet PC, an Ultra-Book, a digital TV, a desktop computer, and the like. However, the configuration according to the embodiment described in this specification can be applied to a display capable device even if it is a new product form to be developed later.

Hereinafter, a semiconductor light emitting device according to an embodiment and a display device including the same will be described.

FIG. 1 is an exemplary view in which the display device 100 according to the embodiment is disposed in the living room together with the washing machine 10, the robot cleaner 20, the air purifier 30, and the like.

The display device 100 of the embodiment can display the state of various electronic products such as the air cleaner 30, the robot cleaner 20, the washing machine 10, and communicate with each electronic product based on IOT and can control each electronic product based on user's setting data.

The display device 100 according to the embodiment can include a flexible display manufactured on a thin and flexible substrate. The flexible display can be bent or rolled like paper while maintaining the characteristics of a conventional flat panel display.

In the flexible display, visual information can be implemented by independently controlling light emission of unit pixels arranged in a matrix form. The unit pixel means a minimum unit for implement one color. The unit pixel of the flexible display can be implemented by a semiconductor light emitting device. In an embodiment, the semiconductor light emitting device can be a Micro-LED, but is not limited thereto.

Next, FIG. 2 is an enlarged view of the first panel area A1 in the display device 100 of FIG. 1.

According to FIG. 2, in the display device 100 of the embodiment, a plurality of panel areas such as the first panel area A1 can be mechanically and electrically connected by tiling to be manufactured.

The first panel area A1 can include a plurality of unit pixels 150L, and each unit pixel 150L can include a first semiconductor light emitting device 150R, a second semiconductor light emitting device 150G, and a third semiconductor light emitting device 150B as sub-pixels. The first, second, and third semiconductor light emitting elements 150R, 150G, 150B can be a red light emitting element R, a green light emitting element G, and a blue light emitting element B, respectively, but are not limited thereto.

In the embodiment, each semiconductor light emitting device can be driven by an active matrix (AM) method or a passive matrix (PM) method.

Next, FIG. 3A is a cross-sectional view taken along line B1-B2 of the first semiconductor light emitting device 150R, which is a sub-pixel, in the first semiconductor pixel region 150L1, which is one unit pixel in FIG. 2. FIG. 3B is a detailed view of the light emitting structure 155 of the first semiconductor light emitting device 150R in FIG. 3A.

Referring to FIG. 3A, in the display device 100 of the embodiment, the first semiconductor pixel region 150L1 can include a panel substrate 110, a first wiring electrode 121, a second wiring electrode 122, an insulating layer 130, and a first semiconductor light emitting device 150R. The panel substrate 110, the first wiring electrode 121, and the second wiring electrode 122 can be referred to as a backplane, but is not limited thereto.

The panel substrate 110 can be formed of glass or polyimide. Also, the panel substrate 110 can include a flexible material such as polyethylene naphthalate (PEN) or polyethylene terephthalate (PET). Also, the panel substrate 110 can be made of a transparent material, but is not limited thereto.

A first wiring electrode 121 and a second wiring electrode 122 can be disposed on the panel substrate 110. The first wiring electrode 121 and the second wiring electrode 122 can include a metal material having excellent electrical conductivity.

For example, the first wiring electrode 121 and the second wiring electrode 122 can be formed of at least one of Titanium (Ti), Chromium (Cr), Nickel (Ni), Aluminum (Al), Platinum (Pt), Gold (Au), Tungsten (W) or Molybdenum (Mo) or an alloy thereof.

The insulating layer 130 can be an adhesive insulating layer or a conductive adhesive layer having conductivity. Since the insulating layer 130 is ductile, it can enable a flexible function of the display device.

Next, each of the semiconductor light emitting devices 150R, 150G, 150B can be red, green, and blue semiconductor light emitting devices to form a unit pixel, but are not limited thereto, and can implement red and green colors by including a red phosphor and a green phosphor, respectively.

Hereinafter, the first semiconductor light emitting device 150R will be mainly described, and the remaining second and third semiconductor light emitting devices 150G and 150B can also adopt the technical features of the first semiconductor light emitting device 150R.

The semiconductor light emitting devices 150R, 150G, 150B that can be employed in the embodiment can be a flip type semiconductor light emitting device as shown in FIG. 3A, but are not limited thereto, and the semiconductor light emitting devices 150R, 150G, 150B can include a lateral type semiconductor light emitting device or a vertical type semiconductor light emitting device.

In the embodiment, the semiconductor light emitting devices 150R, 150G, 150B are p-n junction diodes in which electrical energy is converted into light energy, and can be made of compound semiconductors containing elements of groups III and V on the periodic table, and can implement various colors such as red, green, and blue by controlling band gap energy by adjusting the composition ratio of compound semiconductors.

Referring to FIG. 3A, the first semiconductor light emitting device 150R of the embodiment can include a light emitting structure 155 and a first electrode 151 and a second electrode 152 that apply power to the light emitting structure 155.

Also, the first semiconductor light emitting device 150R can include a first interlayer insulating layer 159 disposed on a side surface of the light emitting structure 155 and can include an adhesive layer 158 disposed on the light emitting structure 155.

FIG. 3B is a detailed view of the light emitting structure 155 of the first semiconductor light emitting device 150R in FIG. 3A. Referring to FIG. 3B for a moment, the light emitting structure 155 can include a first conductivity type semiconductor layer 155a, an active layer 155b, and a second conductivity type semiconductor layer 155c. Also, the light emitting structure 155 can include an undoped semiconductor layer 155d, but is not limited thereto.

The first conductivity type semiconductor layer 155a can be implemented as a group third-fifth compound semiconductor doped with a first conductivity type dopant. When the first conductivity-type semiconductor layer 155a is an n-type semiconductor layer, the first conductivity-type dopant is an n-type dopant and can include Si, Ge, Sn, Se, or Te, but is not limited thereto.

The active layer 155b is a layer in which electrons injected through the first conductivity type semiconductor layer 155a and holes injected through the second conductivity-type semiconductor layer 155c to be formed later meet each other to emit light having an energy determined by an energy band unique to the active layer (light emitting layer) material.

The active layer 155b can be formed of at least one of a single quantum well structure, a multi-quantum well structure (MQW), a quantum-wire structure, or a quantum dot structure.

The well layer/barrier layer of the active layer 155b can be formed in any one or more pair structures of InGaN/GaN, InGaN/InGaN, GaN/AlGaN, InAlGaN/GaN, GaAs (InGaAs), /AlGaAs, GaP (InGaP) or/AlGaP, but is not limited thereto.

The second conductivity-type semiconductor layer 155c can include a group 3-group-5 compound semiconductor doped with a second conductivity-type dopant, for example, a semiconductor material having the composition formula $In_xAl_yGa_{1-x-y}N$ ($0 \le x \le 1$, $0 \le y \le 1$, When the second conductivity-type semiconductor layer 155c is a p-type semiconductor layer, the second conductivity-type dopant is a p-type dopant and can include Mg, Zn, Ca, Sr, Ba, or the like.

Referring back to FIG. 3A, the first semiconductor light emitting device 150R of the embodiment can include a first electrode 151 and a second electrode 152 respectively disposed on the first conductivity type semiconductor layer 155a and the second conductivity type semiconductor layer 155c.

The first electrode 151 can include a first reflective electrode 151a and a first pad electrode 151b, and the second electrode 152 can also include a second reflective electrode 152a and a second pad electrode 152b.

The first electrode 151 and the second electrode 152 can be electrically connected to the first wiring electrode 121 and the second wiring electrode 122 of the panel substrate 110, respectively.

For example, the first pad electrode 151b and the second pad electrode 152b can be electrically connected to the first wiring electrode 121 and the second wiring electrode 122 of the panel substrate 110, respectively.

The first reflective electrode 151a and the second reflective electrode 152a can include a reflective layer made of a metal layer including Al, Ag, or an alloy including Al or Ag.

Also, the first reflective electrode 151a and the second reflective electrode 152a can include one or more metals selected from among Ti, Al, Ag, TiAl, TiAlTi, TiAgTi, MoAl, MoAlMo, or MoAlTi in a single layer or multiple layers.

Also, the first reflective electrode 151a and the second reflective electrode 152a can include the first interlayer insulating layer 159 and a bonding metal such as Ti, Cr, Mo, or Pt as an adhesive layer.

The thickness of the first reflective electrode 151a and the second reflective electrode 152a can be formed from several nm to several tens of nm, and the overall thickness of the first electrode 151 and the second electrode 152 can be formed in a range of several tens of nm to several μm.

The first electrode 151 and the second electrode 152 can be formed by a deposition, plating, or printing process.

The first pad electrode 151b and the second pad electrode 152b can include an ohmic layer, a reflective layer, a bonding layer, and the like. For example, when the first pad electrode 151b and the second pad electrode 152b include an ohmic layer, the first pad electrode 151b and the second pad electrode 152b can include the ohmic layer in which a single metal, a metal alloy, a metal oxide, or the like is stacked in multiples so as to efficiently inject a carrier. For example, the ohmic layer can be formed to include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, Hf, but is not limited to these materials.

Also, the first pad electrode 151b and the second pad electrode 152b can include a bonding layer of Nickel (Ni), Gold (Au), or the like.

One of the technical problems of the embodiment is to solve the problem that the repair process does not proceed properly due to the step issue due to the thickness of the light emitting device package when the repair process is performed in the micro-LED display transfer process.

Also, one of the technical problems of the embodiment is to solve the problem that it is difficult to implement an ultra-thin micro-LED display because a conventional light emitting device package in which a growth substrate remains is thick to improve light extraction efficiency.

According to the semiconductor light emitting device package according to the embodiment and the display device including the same, there are technical effect that can improve the efficiency of the transfer process of the semiconductor light emitting device and the light extraction efficiency of the semiconductor light emitting device package.

For example, referring to FIG. 3A, in the first semiconductor pixel region 150L1 of the embodiment, when the repair process is performed in the micro-LED display transfer process, by implement the first thickness T1 of the first semiconductor light emitting device 150R as ultra-thin, it is possible to solve the problem that the repair process does not proceed properly due to the step issue due to the thickness of the light emitting device package.

For example, unlike the conventional light emitting device package, in the embodiment, by removing the growth substrate and improving the light extraction efficiency by the reflective electrode structure, there are complex technical features that can improve the light extraction efficiency of the semiconductor light emitting device package along with the high efficiency of the transfer process by resolving the step difference issue.

For example, according to the semiconductor light emitting device package according to the embodiment, after performing the transfer process of the semiconductor light emitting device to the panel, by removing the temporary substrate and implement the first thickness T1 of the first semiconductor light emitting device 150R in the first semiconductor pixel region 150L1 to be 10 μm or less ultra-thin. So, when the repair process is performed in the micro-LED display transfer process, it is possible to solve the problem that the repair process does not proceed properly due to the step issue due to the thickness of the light emitting device package.

Also, according to the embodiment, by implementing the cross-sectional shape of the first reflective electrode 151a and the second reflective electrode 152a of the semiconductor light emitting device package into a cup shape, there is a technical effect of improving light extraction efficiency while implement an ultra-thin semiconductor light emitting device package.

For example, according to the embodiment, the first reflective electrode 151a and the second reflective electrode 152a can be disposed to extend to the upper and side surfaces of the first interlayer insulating layer 159.

Also, the second horizontal width W2 of the first reflective electrode 151a or the second reflective electrode 152a is formed longer than the first horizontal width W1 of the first pad electrode 151b or the second pad electrode 152b to improve the reflection performance of the emitted light, at the same time, the cross-sectional shape of the first reflective electrode 151a and the second reflective electrode 152a is implemented as a cup shape, there is a technical effect that can improve the light extraction efficiency.

Also, the second horizontal width W2 of the first reflective electrode 151a or the second reflective electrode 152a is formed longer than the horizontal width of the first wiring electrode 121 or the second wiring electrode 122 formed on the panel substrate 110, thereby improving light extraction efficiency.

Also, the second horizontal width W2 of the first reflective electrode 151a or the second reflective electrode 152a is formed longer than the horizontal width of the light emitting structure 155, thereby improving light extraction efficiency.

Also in the embodiment, in a direction away from the light emitting structure 155, the end of the first reflective electrode 151a or the end of the second reflective electrode 152a is disposed higher than the active layer 155b of the light emitting structure 155, there is a technical effect of improving the light extraction efficiency in the upward direction of the light emitted from the active layer and at the same time allowing the semiconductor light emitting device to exhibit optimal performance as a pixel of the display device in the display device.

For example, when the first semiconductor light emitting device 150R emits light of a red wavelength, light of a white wavelength can be implemented by properly interacting with light of a green wavelength of the second semiconductor light emitting device and light of a blue wavelength of the third semiconductor light emitting device 150B disposed in the same unit pixel.

Next, FIG. 4A is a cross-sectional view of the first-second semiconductor light emitting device 150R2 according to the second embodiment. FIG. 4B is an SEM picture to which the first-second semiconductor light emitting device 150R2 is applied, and is a picture in which the first-second reflective electrode 151a2 and the second-second reflective electrode 152a2 are formed on the light emitting structure 155.

The first-second semiconductor light emitting devices 150R2 of the second embodiment can employ technical features of the first to third semiconductor light emitting devices 150R, 150G, 150B described above. Hereinafter, the second embodiment will be described focusing on the main features.

Referring to FIG. 4A, the second interlayer insulating layer 159r can be wrapped around the light emitting structure 155 through a coating of an interlayer insulating layer material and a photo process or an etching process and can control a slope angle by inducing a reflow characteristic of a material.

Also, according to the second embodiment, without a separate photo process, using an interlayer insulating layer material with good fluidity, in a state where the light emitting structure 155 is arranged, the shape and slope of the resin coating layer can be controlled by using resin coating and thermal reflow characteristics of the resin coating layer. Also, the profile of the cup-shaped second interlayer insulating layer 159r of the second embodiment can be formed through a photocuring, thermal curing, or combined light-heat curing process for curing the resin coating layer.

The second interlayer insulating layer 159r can be formed of a transparent polymer-based resin such as epoxy, acrylic, silicone, BCB ($BaNd_2Ti_4O_{12}$), or urethane. A photosensitive resin or a non-photosensitive resin can be applied to the second interlayer insulating layer 159r. Also, the second interlayer insulating layer 159r can be formed of an inorganic material such as silicon nitride, oxide, or ITO alone or in a laminated structure with resin.

Referring to FIGS. 4A and 4B, in the second embodiment, the second interlayer insulating layer 159r can include a first round inclined surface R1. Accordingly, the first-second reflective electrode 151a2 and the second-second reflective electrode 152a2 disposed on the second interlayer insulating layer 159r can include a second round inclined surface R2 corresponding to the first round inclined surface R1.

According to the second embodiment, as the first-second reflective electrode 151a2 and the second-second reflective electrode 152a2 include the second round inclined surface R2, there are technical effects that the light emitted from the light emitting structure can improve the light extraction efficiency to the upper surface and function optimally as a display pixel through combination with the light emitted from the semiconductor light emitting device of other subpixels within the unit pixel.

Next, referring to FIG. 4A, the first angle Θ formed by the first tangent line L1 to the second round inclined surface R2 of the second-second reflective electrode 152a2 at the edge of the light emitting structure 155 and the side surface of the light emitting structure 155 can be controlled in the range of 10 to 70 degrees to improve light extraction efficiency.

Also, in the second embodiment, as the first angle Θ between the first tangent line L1 and the side surface of the light structure 155 is controlled in the range of 10 to 70 degrees, there is a special technical effect that can function optimally as a display pixel through a combination with lights emitted from semiconductor light emitting devices of other sub-pixels within a unit pixel.

According to the embodiment, light extraction efficiency can be improved by forming a roughness structure such as texturing on the light emitting structure 155. For example, light extraction efficiency can be improved by forming a roughness structure through texturing in the undoped semiconductor layer 155d of the light emitting structure 155.

Hereinafter, the technical effects of the embodiment will be described in more detail.

According to the embodiment, by providing an ultra-thin micro-LED package that can overcome difficulties in application to micro-LED panels due to the thick film thickness of existing commercial LED packages, it can be expected to be applied to the optimal repair process in case of panel lighting failure. Also, there is a technical effect that can be applied to the chip structure development of a new ultra-thin micro-LED panel as well as a repair process.

In particular, according to the embodiment, after manufacturing the light emitting device package, after the transfer process to the second substrate or display panel, by effectively removing the temporary substrate of the light emitting device package, there is a technical effect capable of providing an ultra-thin micro-LED package of 10 μm or less, which is equal to the height of the light emitting device chip.

Also, according to the embodiment, by forming the reflective electrode structure on the transferred micro-LED chip into a cup-shaped structure, there is a technical effect of increasing display panel efficiency by effectively guiding light emitted from the side of the light emitting structure to the upper part of the light emitting element.

Also, according to the embodiment, the reflective electrode itself, which is the configuration of the electrode for driving the micro-LED itself, functions as a driving electrode and is formed in a cup-shaped structure, and by guiding the emitted light to the top of the light emitting device and not forming a separate light extraction structure, there is a technical effect of simplifying the structure of the light emitting device package and increasing the efficiency of the display panel.

Also, according to the second embodiment, as the first-second reflective electrode 151a2 and the second-second reflective electrode 152a2 include the second round inclined surface R2, there is a technical effect that the light emitted from the light emitting structure can improve the light extraction efficiency to the upper surface and function optimally as a display pixel through combination with the light emitted from the semiconductor light emitting device of other sub-pixels within the unit pixel.

Meanwhile, the semiconductor light emitting device package according to the embodiment is a technology capable of innovatively reducing the thickness of the light emitting device package in the final panel by removing the temporary substrate with laser technology after the transfer process, it can be seen that there is a fundamental difference from the conventional grinding and polishing-based partial glass removal process, and that the surface state after glass removal is different from that of the prior art.

Also, if the glass is removed from the temporary substrate before transferring the semiconductor light emitting device package to the panel substrate, there is no method for selectively transferring the semiconductor light emitting device package to the panel substrate because the thickness of the semiconductor light emitting device package is too thin.

Accordingly, as in the embodiment, after manufacturing the light emitting device package, after the transfer process to the second substrate or display panel, by effectively removing the temporary substrate of the light emitting device package, there is a technical effect capable of providing an ultra-thin micro-LED package of 10 μm or less, which is equal to the height of the light emitting device chip.

Hereinafter, a display device including a semiconductor light emitting device according to an exemplary embodiment will be described with reference to FIGS. 5A to 5F.

Specifically, FIGS. 5A to 5F are cross-sectional views of a manufacturing process of the first semiconductor pixel region 150L1, which is one unit pixel shown in FIG. 3A.

First, referring to FIG. 5A, a sacrificial layer 20 is formed on a temporary glass substrate that can be defined as the first substrate 10. The sacrificial layer 20 can be any one or more of thin film ITO, amorphous silicon, and polyimide, but is not limited thereto.

Next, an adhesive layer 158 for transferring the micro-LED chip is formed on the sacrificial layer 20. The adhesive layer 158 can be a transparent polymer-based resin such as epoxy, acrylic, silicone, BCB, or urethane, but is not limited thereto.

Next, as shown in FIG. 5B, the light emitting structure 155 of the semiconductor light emitting device is transferred onto the adhesive layer 158. In the transfer, the light emitting structures of the first to third semiconductor light emitting devices 150R, 150G, 150B can be individually transferred or the light emitting structures of the first to third semiconductor light emitting devices 150R, 150G, 150B can be integrally transferred.

Next, as shown in FIG. 5C, a first interlayer insulating layer 159 is formed on a side surface of the light emitting structure 155. The first interlayer insulating layer 159 can be formed of a transparent polymer-based resin such as epoxy, acrylic, silicone, BCB ($BaNd_2Ti_4O_{12}$), or urethane. The first interlayer insulating layer 159 can be made of photosensitive resin or non-photosensitive resin. Also, the first interlayer insulating layer 159 can be made of an inorganic material such as silicon nitride, oxide, or ITO alone or in a laminated structure with resin.

The first interlayer insulating layer 159 can be coated using spin coating, bar coating, slit coating, or the like. A hard curing process can be performed on the first interlayer insulating layer 159 by a UV or heat treatment process.

Next, referring to FIG. 5D, a first electrode 151 and a second electrode 152 are formed on the light emitting structure 155 by a sputtering process or the like. For example, a first reflective electrode 151a and a second reflective electrode 152a can be formed on the first interlayer insulating layer 159 and the light emitting structure 155, and a first pad electrode 151b and a second pad electrode 152b can be formed on the first reflective electrode 151a and the second reflective electrode 152a, respectively.

For example, the first reflective electrode 151a and the second reflective electrode 152a can include a reflective layer made of a metal layer including Al, Ag, or an alloy including Al or Ag.

Also, the first reflective electrode 151a and the second reflective electrode 152a can include one or more metals selected from among Ti, Al, Ag, TiAl, TiAlTi, TiAgTi, MoAl, MoAlMo, or MoAlTi in a single layer or multiple layers. Also, a metal such as Ti, Cr, Mo, or Pt can be used as an adhesive layer for the first reflective electrode 151a and the second reflective electrode 152a.

When the first pad electrode 151b and the second pad electrode 152b include an ohmic layer, the ohmic layer in which a single metal, a metal alloy, or a metal oxide is multi-layered can be included to efficiently perform carrier injection. Also, the first pad electrode 151b and the second pad electrode 152b can include a bonding layer of nickel (Ni) or gold (Au).

Next, as shown in FIG. 5E, after taping for the transfer process and dicing process for cutting into individual packages, a transfer process or a bonding process can be performed on the diced individual semiconductor light emitting device package in the form of a flip chip to the second substrate or the panel substrate 110. In the transfer process, individual packages can be transferred using a pick-and-place method, and a plurality of packages can be simultaneously transferred onto the panel substrate 110 using a donor material having a certain area. Also, the package can be transferred by attaching a film such as NCF (Non Conductive Film) in the state of the first substrate and attaching and bonding the film to the panel substrate 110 as it is.

The panel substrate 110 includes an anisotropic conductive film (ACF) or an isotropic conductive paste (ACP), a first wiring electrode 121, and a second wiring electrode 122 in advance in the area where the package of the first substrate 10 is to be transferred. Various types of electrodes such as first wiring electrode 121, and a second wiring electrode 122, bumps, etc. are present in a state in which a bonding process can be performed along with transfer.

Next, as shown in FIG. 5F, the temporary glass substrate, which is the first substrate can be removed by a method such as laser irradiation while being transferred and bonded to the panel substrate 110, at this time, the sacrificial layer 20 can also be removed together with the first substrate 10.

An insulating layer 130 can be formed on the panel substrate 110. The insulating layer 130 can be formed after the transfer process of the semiconductor light emitting device package, but can also be disposed before the transfer process.

The insulating layer 130 can include an insulating and flexible material such as polyimide, PEN, or PET, and can be formed integrally with the panel substrate 110 to form a single substrate. The insulating layer 130 can be an adhesive insulating layer or a conductive adhesive layer having conductivity. Since the insulating layer 130 is ductile, it can enable a flexible function of the display device.

According to the semiconductor light emitting device package according to the embodiment and the display device including the same, there are technical effects that can improve the efficiency of the transfer process of the semiconductor light emitting device and the light extraction efficiency of the semiconductor light emitting device package.

For example, referring to FIG. 5F, by implementing the first thickness T1 of the first semiconductor light emitting element 150R in the first semiconductor pixel region 150L1 of the embodiment to be about 10 μm ultra-thin, when the repair process is performed in the micro-LED display transfer process, it is possible to solve the problem that the repair process does not proceed properly due to the step issue due to the thickness of the light emitting device package.

For example, unlike the conventional light emitting device package, in the embodiment, by removing the growth substrate and improving the light extraction efficiency by the reflective electrode structure, there are complex technical features that can improve the light extraction efficiency of the semiconductor light emitting device package along with the high efficiency of the transfer process by resolving the step difference issue.

For example, according to the semiconductor light emitting device package of the embodiment, after performing the transfer process of the semiconductor light emitting device to the panel, the first thickness T1 of the first semiconductor light emitting device 150R in the first semiconductor pixel region 150L1 can be implemented as 10 μm or less ultra-thin by removing the temporary glass substrate. So, when the repair process is performed in the micro-LED display transfer process, it is possible to solve the problem that the repair process does not proceed properly due to the step issue due to the thickness of the light emitting device package.

Next, according to the embodiment, by implementing the cross-sectional shape of the first reflective electrode 151a and the second reflective electrode 152a of the semiconductor light emitting device package into a cup shape, there is a technical effect of improving light extraction efficiency while implement an ultra-thin semiconductor light emitting device package.

For example, according to the embodiment, the first reflective electrode 151a and the second reflective electrode 152a can be disposed to extend to the upper and side surfaces of the first interlayer insulating layer 159. Also, by forming the second horizontal width W2 of the first reflective electrode 151a or the second reflective electrode 152a longer than the first horizontal width W1 of the first pad electrode 151b or the second pad electrode 152b, the cross-sectional shapes of the first reflective electrode 151a and the second reflective electrode 152a can be implemented in a cup shape, so there is a technical effect of improving light extraction efficiency.

Also, there is a technical effect of improving light extraction efficiency by forming the second horizontal width W2 of the first reflective electrode 151a or the second reflective electrode 152a longer than the horizontal width of the first wiring electrode 121 or the second wiring electrode 122.

Also, there is a technical effect of improving light extraction efficiency by forming the second horizontal width W2 of the first reflective electrode 151a or the second reflective electrode 152a longer than the horizontal width of the light emitting structure.

Also, in the embodiment, by the end of the first reflective electrode 151a or the end of the second reflective electrode 152a is disposed higher than the active layer 155b of the light emitting structure 155, there is a technical effect that can improve the light extraction efficiency of the light emitted from the active layer to the upper side and contribute to the function as a pixel of the display device.

Next, referring to FIGS. 4A and 4B, in the second embodiment, the second interlayer insulating layer 159r can include a first round inclined surface R1. Accordingly, the first-second reflective electrode 151a2 and the second-second reflective electrode 152a2 disposed on the second interlayer insulating layer 159r can include a second round inclined surface R2.

According to the second embodiment, as the first-second reflective electrode 151a2 and the second-second reflective electrode 152a2 include the second round inclined surface R2, there are technical effects that the light emitted from the light emitting structure can improve the light extraction efficiency to the upper surface and function optimally as a display pixel through combination with the light emitted from the semiconductor light emitting device of other sub-pixels within the unit pixel.

Next, FIG. 6A is a conceptual diagram of the second panel area A2 in the display device 100 according to the second embodiment, which is an additional embodiment, FIG. 6B is a detailed projection view of the wiring structure of the auxiliary pixel in FIG. 6A, and FIG. 6C is a conceptual cross-sectional view taken along line B3-B4 in FIG. 6A.

In the second embodiment, the second panel area A2 can include a main pixel 150LM and auxiliary pixels 150LR1 and 150LR2. The main pixel 150LM can include a main semiconductor light emitting device group 160D, and the second auxiliary pixel 150LR2 can include an auxiliary semiconductor light emitting device group 150D.

For example, the main pixel 150LM can include a main semiconductor light emitting device group 160D including a first main semiconductor light emitting device 160R, a second main semiconductor light emitting device 160G, and a third main semiconductor light emitting device 160B. The first to third main semiconductor light emitting devices 160R, 160G, and 160B can be a red light emitting device, a green light emitting device, and a blue light emitting device, respectively, and can respectively correspond to the first to third semiconductor light emitting devices 150R, 150G, 150B described above.

Also, the second auxiliary pixel 150LR2 can include an auxiliary semiconductor light emitting device group 150D including a first auxiliary semiconductor light emitting device 150r, a second auxiliary semiconductor light emitting device 150g, and a third auxiliary semiconductor light emitting device 150b. The first to third auxiliary semiconductor light emitting devices 150r, 150g, 150b can be a red light emitting device, a green light emitting device, and a blue light emitting device, respectively, but are not limited thereto.

According to the second embodiment, a test is performed after main semiconductor light emitting devices are transferred to a panel, and when a defective chip is found in the main pixel 150LM, repair is performed through an auxiliary request.

For example, when the first main semiconductor light emitting device 160R in the first main pixel 160LM1 is inspected to be defective, a repair process can be performed with the first auxiliary semiconductor light emitting device 150r in a region of the first auxiliary pixel 150LR1 adjacent to the corresponding first main pixel 160LM1.

Also, when the first to third main semiconductor light emitting elements 160R, 160G, and 160B in the second main pixel 160LM2 are inspected as defective, a repair process can be performed with the first to third auxiliary semiconductor light emitting devices 150r, 150b, 150b in the region of the second auxiliary pixel 150LR1 adjacent to the corresponding second main pixel 160LM2.

According to the second embodiment, by implement the thickness of the auxiliary semiconductor light emitting elements 150r, 150g, 150b constituting the auxiliary pixel to be ultra-thin, there is a special technical effect that can solve the problem that the repair process does not proceed properly due to the step issue due to the thickness of the light emitting device package during the repair process in the micro-LED display transfer process The auxiliary semiconductor light emitting devices 150r, 150b, 150b can adopt technical characteristics of the first to third ultra-thin semiconductor light emitting devices 150R, 150G, 150B described above.

For example, referring to FIG. 6c, according to the second embodiment, the first auxiliary semiconductor light emitting element 150r constituting the first auxiliary pixel 150LR1 can have the structure of the first semiconductor light emitting element 150R in the form of an ultra-thin flip chip described above, and the first main semiconductor light emitting device 160R constituting the main pixel 160LM can be a horizontal type semiconductor light emitting chip. Of course, the first main semiconductor light emitting device 160R constituting the main pixel 160LM in the second embodiment can have the structure of the first semiconductor light emitting device 150R of the ultra-thin flip chip type described above.

Continuing to refer to FIG. 6C, according to the second embodiment, the first thickness T1 of the first auxiliary semiconductor light emitting element 150r constituting the first auxiliary pixel 150LR1 can be implemented in an ultra-thin type of about 10 μm, and the second thickness T2 of the first main semiconductor light emitting device 160R constituting the main pixel 160LM can be implemented at the same level. Accordingly, there is a special technical effect that can solve the problem that the repair process does not proceed properly due to the step issue due to the thickness of the light emitting device package when the repair process is performed in the micro-LED display transfer process.

According to the embodiment, a top of the first auxiliary semiconductor light emitting device 150r constituting the first auxiliary pixel 150LR1 and a top of the first main semiconductor light emitting device 160R constituting the main pixel 160LM can be controlled at the same or equal level, and an optical luminance difference between the main pixel and the auxiliary pixel can be minimized. Accordingly, the embodiment has a technical effect capable of implementing an optimal display device.

According to the embodiment, the first to third auxiliary semiconductor light emitting devices disposed on the auxiliary pixel can be integrated in the form of an auxiliary semiconductor light emitting device package. That is, according to the embodiment, it is possible to mount and repair individual auxiliary semiconductor light emitting devices, but there is also a technical feature that the repair process can be performed in the form of an auxiliary semiconductor light emitting device package in which three colors of auxiliary semiconductor light emitting devices are packaged.

Accordingly, when the repair is performed in the form of a light emitting device package, a thickness step can occur between the semiconductor light emitting device of the main pixel and the auxiliary semiconductor light emitting device package. As the repair process proceeds using the auxiliary semiconductor light emitting device package in which the auxiliary semiconductor light emitting device is implemented in an ultra-thin type as in the embodiment, in the embodiment, the top of the auxiliary semiconductor light emitting device and the top of the main semiconductor light emitting device constituting the main pixel can be controlled at the same or equivalent level and an optical luminance difference between a main pixel and an auxiliary pixel can be minimized. Accordingly, the embodiment has a special technical effect capable of implementing an optimal display device.

Next, referring to FIG. 6B, by forming a common wire MC in the second auxiliary pixel 150LR2 region, flip-chip bonding of the first to third auxiliary semiconductor light emitting elements can be easily performed, the wiring structure can be managed compactly, and the efficiency of the light emitting element driving circuit can be improved.

the common wire MC structure can also be formed in the region of the first auxiliary pixel 150LR1.

Referring to FIG. 6B, the second auxiliary pixel 150LR2 can include a common wire MC, a first wire M1, a second wire M2, and a third wire M3. The common wiring MC can include a wiring pad MCa and a common branch wiring MCb. The first wire M1 can include a first pad M1a and a first branch wire M1b, the second wire M2 can include a second pad M2a and a second branch wire M2b, and the third wire M3 can include a third pad M3a and a third branch wire M3b.

The common wire MC and the first wire M1, the second wire M2 and the third wire M3 of the second auxiliary pixel 150LR2 and corresponding wire pads can be formed on the panel substrate 110. For example, a first wiring pad 120a, a second wiring pad 120b, third wiring pad 120c and fourth wiring pad 120d can be formed on the panel substrate 110 to correspond to the common wiring MC, the first wiring M1, the second wire M2 and the third wire M3, respectively.

The first auxiliary semiconductor light emitting device 150r can be mounted in a flip chip form on the common branch wiring MCb and the first branch wiring M1b. Also, the second auxiliary semiconductor light emitting device 150g can be mounted in a flip chip form on the common branch wiring MCb and the second branch wiring M2b. Also, the third auxiliary semiconductor light emitting device 150b can be mounted in a flip chip form on the common branch wiring MCb and the third branch wiring M3b.

Through this, by forming a common wire MC in the second auxiliary pixel 150LR2 region in the second embodiment, flip-chip bonding of the first to third auxiliary semiconductor light emitting elements can be easily performed, the wiring structure can be managed compactly, and the efficiency of the light emitting element driving circuit can be improved.

The common wire MC in the second embodiment can also be applied to the mounting of the first to third semiconductor light emitting devices 150R, 150G, 150B in the first panel area A1 of FIG. 2 described above.

According to the semiconductor light emitting device package according to the embodiment and the display device including the same, there are complex technical effects capable of improving light extraction efficiency of the semiconductor light emitting device package along with high efficiency of the transfer process of the semiconductor light emitting device.

For example, according to the embodiment, when the repair process is performed in the micro-LED display transfer process, it is possible to solve the problem that the repair process does not proceed properly due to the step issue due to the thickness of the light emitting device package.

Also, the embodiment can solve the problem that it is difficult to implement an ultra-thin micro-LED display due to the thickness of the conventional light emitting device package in which the growth substrate remains in order to improve the light extraction efficiency.

For example, according to the embodiment, by implementing the cross-sectional shape of the first reflective electrode 151a and the second reflective electrode 152a of the semiconductor light emitting device package into a cup shape, there is a technical effect of improving light extraction efficiency while implement an ultra-thin semiconductor light emitting device package.

Also, for example, in the embodiment, by the end of the first reflective electrode 151a or the end of the second reflective electrode 152a is disposed higher than the active layer 155b of the light emitting structure 155, there is a technical effect that can improve the light extraction efficiency of the light emitted from the active layer to the upper side and contribute to the function as a pixel of the display device.

Also, according to the second embodiment, as the first-second reflective electrode 151a2 and the second-second reflective electrode 152a2 include the second round inclined surface R2, there are technical effects that the light emitted from the light emitting structure can improve the light extraction efficiency to the upper surface and function optimally as a display pixel through combination with the light emitted from the semiconductor light emitting device of other sub-pixels within the unit pixel.

Also, according to the embodiment, by forming a common wire in the second auxiliary pixel region, flip-chip bonding of the first to third auxiliary semiconductor light emitting elements can be easily performed, the wiring structure can be managed compactly, and the efficiency of the light emitting element driving circuit can be improved.

INDUSTRIAL APPLICABILITY

The semiconductor light emitting device according to the embodiment is not limited to the micro LED, and includes mini LED.

The semiconductor light emitting device according to the embodiment can be applied to an LED having a relatively large area for illumination and signage also to the micro LED display.

Also, a semiconductor light emitting device package according to an embodiment and a display device including the same can include a digital TV, a mobile phone, a smart phone, a laptop computer, a digital broadcasting terminal, a PDA (personal digital assistants), a portable multimedia player (PMP), a navigation, a slate PC, a tablet PC, an ultra-book, a desktop computer, and the like.

The above description is merely an example of the technical idea of the embodiment, and various modifications and variations can be made to those skilled in the art without departing from the essential characteristics of the embodiment.

Therefore, the embodiments disclosed in the examples are not intended to limit the technical idea of the embodiment but to explain, and the scope of the technical idea of the embodiment is not limited by these examples.

The protection scope of the embodiment should be interpreted according to the claims below, and all technical ideas within the scope equivalent thereto should be construed as being included in the scope of rights of the embodiment.

The invention claimed is:

1. A semiconductor light emitting device package comprising:
   a light emitting structure having a first conductivity type semiconductor layer, an active layer, and a second conductivity type semiconductor layer;
   a first electrode and a second electrode electrically connected to the first conductivity type semiconductor layer and the second conductivity type semiconductor layer of the light emitting structure, respectively;
   an interlayer insulating layer disposed on a side surface of the light emitting structure; and
   an adhesive layer disposed on the light emitting structure,
   wherein the first electrode comprises a first reflective electrode and a first pad electrode,
   wherein the second electrode also comprises a second reflective electrode and a second pad electrode,
   wherein a cross-sectional shape of the first reflective electrode and the second reflective electrode comprises a cup shape, and
   wherein a second horizontal width of the first reflective electrode or the second reflective electrode is longer than a horizontal width of the light emitting structure.

2. The semiconductor light emitting device package according to claim 1, wherein a first thickness from the first electrode to the adhesive layer is 10 μm or less.

3. The semiconductor light emitting device package according to claim 1, wherein the first reflective electrode and the second reflective electrode are disposed to extend to upper and side surfaces of the interlayer insulating layer.

4. The semiconductor light emitting device package according to claim 1, wherein the second horizontal width of the first reflective electrode or the second reflective electrode is longer than a first horizontal width of the first pad electrode or the second pad electrode.

5. The semiconductor light emitting device package according to claim 1, wherein an end of the first reflective electrode or an end of the second reflective electrode located in a direction away from the light emitting structure is disposed higher than the active layer of the light emitting structure.

6. The semiconductor light emitting device package according to claim 1, wherein the first pad electrode or the second pad electrode comprises an ohmic layer.

7. The semiconductor light emitting device package according to claim 1, wherein the first reflective electrode or the second reflective electrode is positioned higher as a distance from the light emitting structure increases.

8. A semiconductor light emitting device package comprising:
a light emitting structure having a first conductivity type semiconductor layer, an active layer, and a second conductivity type semiconductor layer;
a first electrode and a second electrode electrically connected to the first conductivity type semiconductor layer and the second conductivity type semiconductor layer of the light emitting structure, respectively;
an interlayer insulating layer disposed on a side surface of the light emitting structure; and
an adhesive layer disposed on the light emitting structure,
wherein the first electrode comprises a first reflective electrode and a first pad electrode,
wherein the second electrode also comprises a second reflective electrode and a second pad electrode,
wherein a cross-sectional shape of the first reflective electrode and the second reflective electrode comprises a cup shape, and
wherein the interlayer insulating layer comprises a first round inclined surface.

9. The semiconductor light emitting device package according to claim 8, wherein the first reflective electrode and the second reflective electrode disposed on the interlayer insulating layer comprises a second round inclined surface corresponding to the first round inclined surface.

10. The semiconductor light emitting device package according to claim 8, wherein a first angle between a first tangent line to the second round inclined surface of the second reflective electrode at an edge of the light emitting structure and the side surface of the light emitting structure is in a range of 10 to 70 degrees.

11. A display device comprising:
a panel substrate having a first wiring electrode and a second wiring electrode; and
a semiconductor light emitting device package disposed on the panel substrate,
wherein the semiconductor light emitting device package comprises a light emitting structure having a first conductivity type semiconductor layer, an active layer, and a second conductivity type semiconductor layer; a first electrode and a second electrode electrically connected to the first conductivity type semiconductor layer and the second conductivity type semiconductor layer of the light emitting structure, respectively; an interlayer insulating layer disposed on a side surface of the light emitting structure; and an adhesive layer disposed on the light emitting structure,
wherein the first electrode comprises a first reflective electrode and a first pad electrode,
wherein the second electrode also comprises a second reflective electrode and a second pad electrode,
wherein a cross-sectional shape of the first reflective electrode and the second reflective electrode comprises a cup shape,
wherein the display device comprises a main pixel and an auxiliary pixel,
wherein the auxiliary pixel comprises a common wiring, a first wiring, a second wiring, and a third wiring,
wherein a first auxiliary semiconductor light emitting device is mounted in a flip chip form on the common wiring and the first wiring,
wherein a second auxiliary semiconductor light emitting device is mounted in a flip chip form on the common wiring and the second wiring, and
wherein a third auxiliary semiconductor light emitting device is mounted on the common wiring and the third wiring in a flip chip form.

12. The display device according to claim 11, wherein a second horizontal width of the first reflective electrode or the second reflective electrode is longer than a horizontal width of the first wiring electrode or the second wiring electrode disposed on the panel substrate.

13. The display device according to claim 11, wherein the common wiring comprises a wiring pad and a common branch wiring,
wherein the first wiring comprises a first pad and a first branch wiring,
wherein the second wiring comprises a second pad and a second branch wiring,
wherein the third wiring comprises a third pad and a third branch wiring,
wherein the first auxiliary semiconductor light emitting device is mounted in a flip chip form on a first region of the common branch wiring and on the first branch wiring;
wherein the second auxiliary semiconductor light emitting device is mounted in a flip chip form on a second region of the common branch wiring and on the second branch wiring; and
wherein the third auxiliary semiconductor light emitting device is mounted in a flip chip form on a third region of the common branch wiring and on the third branch wiring.

14. The display device according to claim 11, wherein a width of the first pad electrode is smaller than a width of the first wiring electrode.

15. The display device according to claim 11, wherein the first reflective electrode and the second reflective electrode are disposed to extend to upper and side surfaces of the interlayer insulating layer.

16. The display device according to claim 11, wherein the first reflective electrode or the second reflective electrode is positioned higher as a distance from the light emitting structure increases.

17. The display device according to claim 11, wherein the interlayer insulating layer comprises a first round inclined surface.

18. The display device according to claim 17, wherein the first reflective electrode and the second reflective electrode disposed on the interlayer insulating layer comprise a second round inclined surface corresponding to the first round inclined surface.

\* \* \* \* \*